United States Patent [19]

Kasa et al.

[11] Patent Number: 5,195,057
[45] Date of Patent: Mar. 16, 1993

[54] SEMICONDUCTOR MEMORY DEVICE HAVING A REDUNDANT MEMORY WHICH CAN BE SELECTIVELY PLACED IN A NOT-IN-USE STATUS

[75] Inventors: Yasushi Kasa; Yuji Arayama; Seiji Hirayama, all of Kawasaki, Japan

[73] Assignee: Fujitsu Limited, Kawasaki, Japan

[21] Appl. No.: 584,311

[22] Filed: Sep. 18, 1990

[30] Foreign Application Priority Data

Sep. 18, 1989 [JP] Japan .................. 1-240957

[51] Int. Cl.$^5$ .............................................. G11C 7/00
[52] U.S. Cl. ............................... 365/200; 365/189.07;
371/10.3
[58] Field of Search ............. 365/200, 189.07, 230.06;
371/10.1, 10.2, 10.3

[56] References Cited

U.S. PATENT DOCUMENTS 4,639,897 1/1987 Wacyk ................. 365/200
4,905,192 2/1990 Nogani et al. ........ 365/200

FOREIGN PATENT DOCUMENTS

0234907A2 9/1987 European Pat. Off. .
2611400A1 9/1988 France .

Primary Examiner—Joseph A. Popek
Attorney, Agent, or Firm—Armstrong, Westerman, Hattori, McLeland & Naughton

[57] ABSTRACT

This invention configures a semiconductor memory device in the following manner. The semiconductor contains a first memory part and more than one redundant circuit that is used when the first memory part is faulty, and each redundant circuit memorizes in its status memory part whether a second memory part which becomes a spare cell is in a not-in-use status, in an in-use status or in an out-of-use status, which means that a failure exists in the second memory part. If a second memory part is in the out-of-use status, its access is prohibited, and the other second memory part without a failure is accessed. With this configuration, when a spare cell is confirmed to have a failure after the spare cell is programmed, the spare cell is put in the out-of-use status, thereby preventing the spare cell from being accessed. Consequently, the yield of the semiconductor device is increased.

7 Claims, 12 Drawing Sheets

Fig. 2

| STATUS MEMORY PART | COMPARISON CIRCUIT | COMPARISON SIGNAL |
|---|---|---|
| NOT-IN -USE "0" | DOT NOT CARE | MISMATCH "0" |
| IN-USE "1" | INPUT ADDRESS ≠ MEMORY ADDRESS | MISMATCH "0" |
| | INPUT ADDRESS = MEMORY ADDRESS | MATCH "1" |

| STATUS MEMORY PART | COMPARISON CIRCUIT | COMPARISON SIGNAL |
|---|---|---|
| NOT-IN-USE "0" | DOT NOT CARE | MISMATCH "0" |
| IN-USE "1" | INPUT ADDRESS ≠ MEMORY ADDRESS | MISMATCH "0" |
| IN-USE "1" | INPUT ADDRESS = MEMORY ADDRESS | MATCH "1" |
| OUT-OF-USE "0" | DOT NOT CARE | MISMATCH "0" |

| STATUS MEMORY PART | | | COMPARISON CIRCUIT | COMPARISON SIGNAL |
|---|---|---|---|---|
| MEMORY B | MEMORY A | STATUS | | |
| 0 | 0 | NOT IN-USE | DO NOT CARE | MISMATCH "0" |
| 0 | 1 | IN-USE | INPUT ADDRESS ≠ MEMORY ADDRESS | MISMATCH "0" |
| 0 | 1 | IN-USE | INPUT ADDRESS = MEMORY ADDRESS | MATCH "1" |
| 1 | DO NOT CARE | OUT OF-USE | DO NOT CARE | MISMATCH "0" |

| STATUS MEMORY PART | | STATUS | COMPARISON CIRCUIT | COMPARISON SIGNAL |
|---|---|---|---|---|
| MEMORY B | MEMORY A | | | |
| 0 | 0 | NOT-IN-USE | DO NOT CARE | MISMATCH "0" |
| 0 | 1 | IN-USE (STATUS 1) | INPUT ADDRESS ≠ MEMORY ADDRESS | MISMATCH "0" |
| 0 | 1 | IN-USE (STATUS 1) | INPUT ADDRESS = MEMORY ADDRESS | MATCH "1" |
| 1 | 0 | IN-USE (STATUS 2) | INPUT ADDRESS ≠ MEMORY ADDRESS | MISMATCH "0" |
| 1 | 0 | IN-USE (STATUS 2) | INPUT ADDRESS = MEMORY ADDRESS | MATCH "1" |
| 1 | 1 | OUT-OF-USE | DO NOT CARE | MISMATCH "0" |

| STATUS MEMORY PART | | | | COMPARISON SIGNAL | SELECTED CELL |
|---|---|---|---|---|---|
| 74-1 | 74-2 | ... | 74-n | | |
| — | — | — | — | MISMATCH | MAIN CELL 80 |
| NOT-IN-USE | NOT-IN-USE | NOT-IN-USE | NOT-IN-USE | MATCH | MAIN CELL 80 |
| IN-USE | NOT-IN-USE | NOT-IN-USE | NOT-IN-USE | MATCH | SPARE CELL 72-1 |
| — | IN-USE | NOT-IN-USE | NOT-IN-USE | MATCH | SPARE CELL 72-2 |
| — | — | ... | — | MATCH | ... |
| — | — | — | IN-USE | MATCH | SPARE CELL 72-n |

Fig. 12

SEMICONDUCTOR MEMORY DEVICE HAVING A REDUNDANT MEMORY WHICH CAN BE SELECTIVELY PLACED IN A NOT-IN-USE STATUS

BACKGROUND OF INVENTION

This invention relates to a semiconductor memory device, and more particularly to a redundant circuit in such semiconductor memory device.

Recently, an internally equipped redundant circuit has been demanded to increase the yield of a semiconductor device. This will soon also become necessary for a PROM and a mask ROM. Since a mask ROM cannot use a spare cell for its redundant circuit, a PROM is used as a substitute for the spare cell.

This redundant circuit is used when the main cell is faulty, and a higher yield is expected if the device is equipped with more than one redundant circuit. In this example, the device is assumed to be equipped with two redundant circuits.

When it is equipped with two redundant circuits, the semiconductor memory device can still operate when the main cell has one or two failures. When the main cell has no failure, both redundant circuits are in the not-in-use status. When it has one failure, one of the two redundant circuits is put into the in-use status while the other is left in the not-in-use status. When it has two failures, both redundant circuits are put into the in-use status. In all of these cases, the semiconductor memory device is operable.

Since failures occur randomly, they may occur in the main cell or in the redundant circuits. If a failure occurs in one of the redundant circuits, there is no problem, providing a failure does not occur simultaneously in the main cell, since in this case neither of the redundant circuits would be put into the in-use status anyway. If a failure occurs simultaneously in the main cell, a problem may arise, since the failed redundant circuit may be put into the in-use status. However, a problem does not arise if the non-failing circuit is put into the in-use status.

Thus, when a failure occurs in the main cell, the failed circuit is put into the in-use status and the non-failing circuit is put into the not-in-use status, the failure of the main cell is not cured and the device remains faulty.

Therefore, it is desirable to prohibit the use of a failed redundant circuit and to put the non-failing circuit into the in-use status.

DESCRIPTION OF THE RELATED ART

Figure 1:
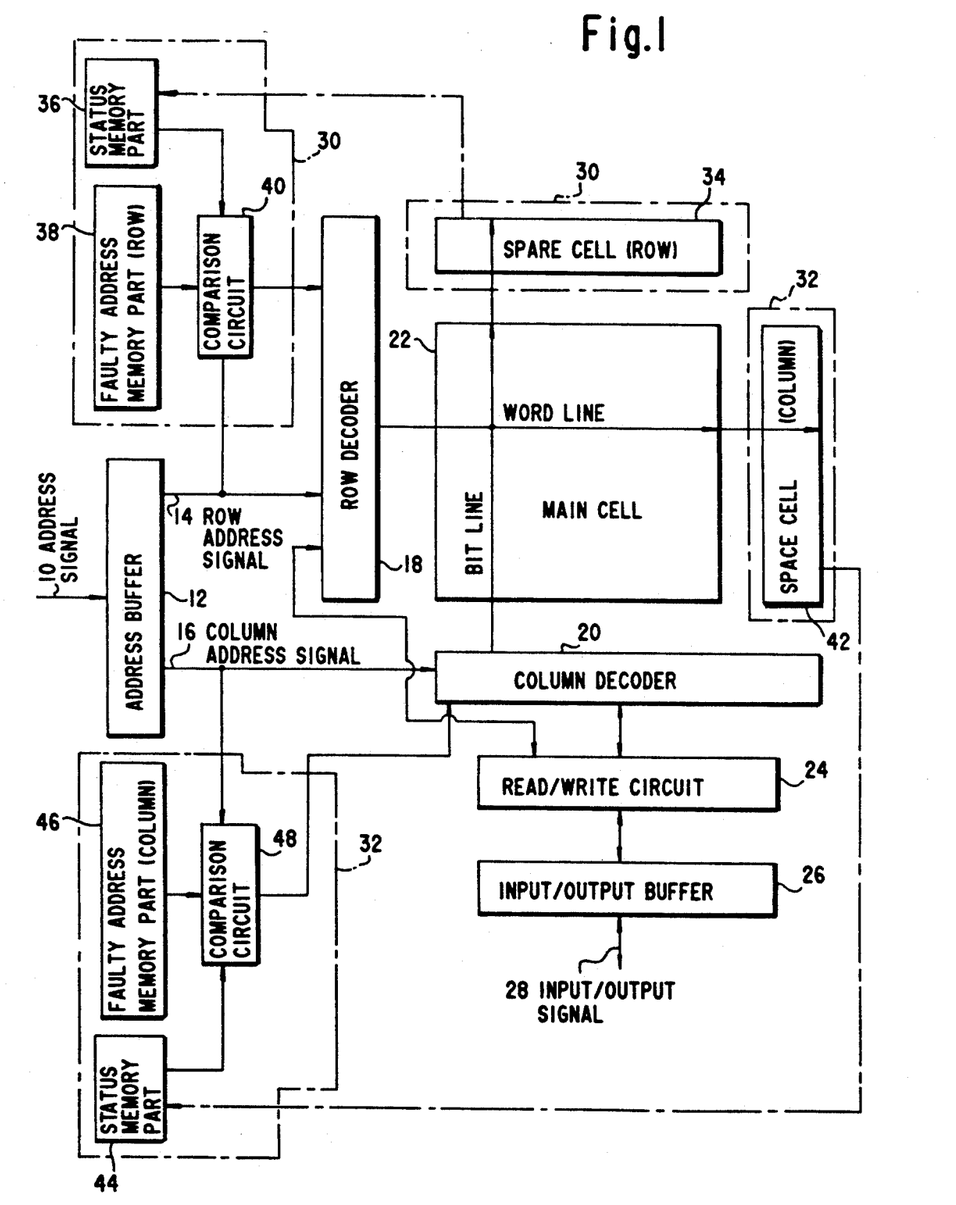
FIG. 1 is a system chart of a semiconductor device with a redundant

FIG. 1 shows the configuration of a semiconductor memory device with a redundant circuit.

In FIG. 1, an address signal 10 is supplied to an address buffer 12 from which a row address signal 14 and a column address signal 16 are supplied respectively to a row decoder 18 and a column decoder 20. A main cell 22 is accessed by the row decoder 18 and the column decoder 20. The content of the main cell 22 that is accessed is supplied to a read/write circuit 24 through the row decoder 18 and the column decoder 20. 26 is an input/output buffer and 28 is an input/output signal. The device is equipped with redundant cells to relieve it when the main cell 22 has a failure. 30 is a row redundant circuit and 32 is a column redundant circuit.

The row redundant circuit 30 is explained first. A status memory part 36 memorizes whether a row spare cell 34 is in the not-in-use status or in the in-use status. A faulty address memory part 38 memorizes the row address having a failure in the main cell 22, namely, the faulty address. A comparison circuit 40 has the spare cell 34 get accessed in lieu of the main cell 22, only where the memory address from the faulty address memory part 38 and the input address (a row address signal 14) are matched after a comparison, when the status memory part 36 shows that the spare cell 34 is in the in-use status. The column redundant circuit 32 is configured similarly to the row redundant circuit 30 and has a column spare cell 42, a status memory part 44, a faulty address memory part 46 and a comparison circuit 48.

Figure 2:
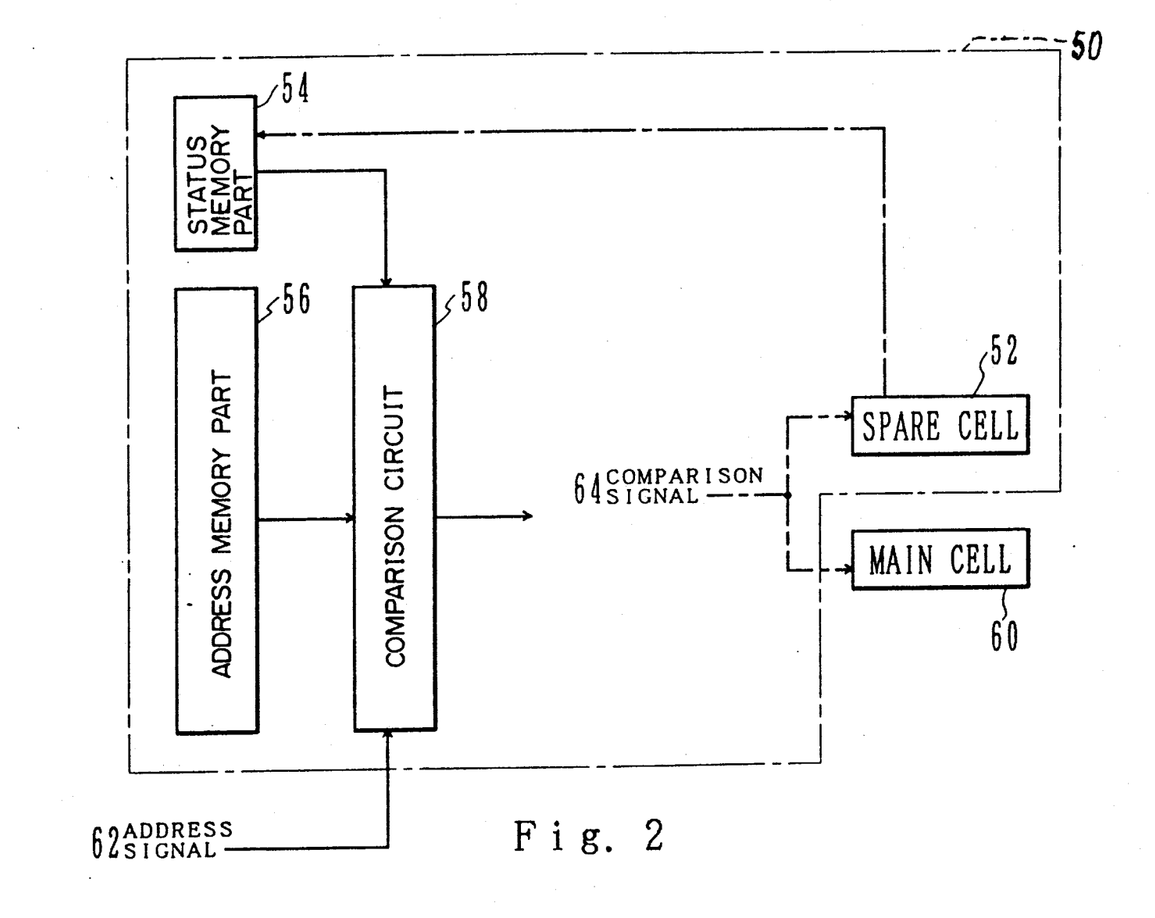
FIGS. 2 and 3 are a circuit diagram and an action explanation chart, respectively, of an existing redundant circuit.
Figure 3:
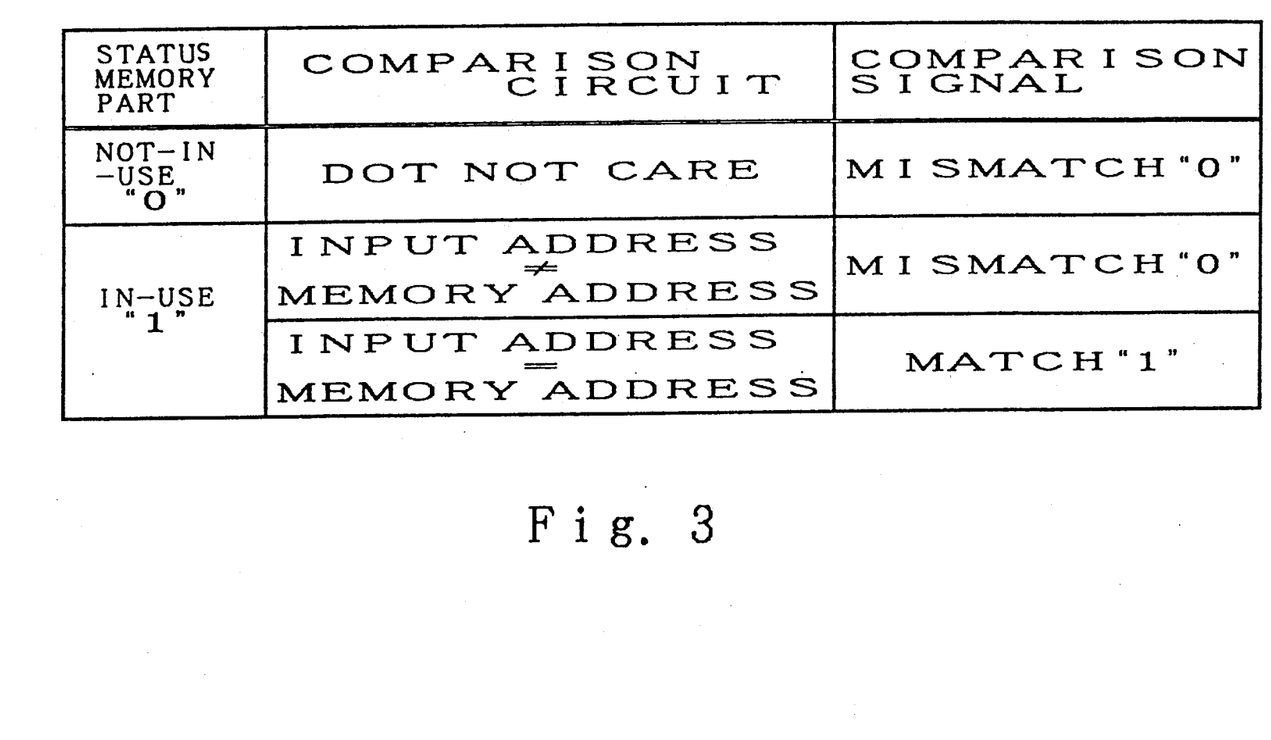

FIG. 2 shows a simplified scheme of an existing redundant circuit, and FIG. 3 shows its action.

In FIG. 2, a redundant circuit 50 has a spare cell 52, a status memory part 54, a faulty address memory part 56 and a comparison circuit 58. 60 is a main cell.

In FIGS. 2 and 3, when the status memory part 54 shows that the spare cell 52 is in the not-in-use status, i.e. "0" level, the comparison signal 64 from the comparison circuit 58 shows a mismatch, i.e. "0" level, regardless of a match or a mismatch of the memory address from the faulty address memory part 56 and the input address of the address signal 62. This enables the main cell 60 to be accessed.

When the status memory part 54 shows that the spare cell 52 is in the in-use status, i.e. the "1" level, the comparison signal 64 from the comparison circuit 58 for a match of the memory address and the input address is different from that for a mismatch. That is, if the memory address and the input address are in a mismatch, the comparison signal 64 shows a mismatch, i.e. "0" level, which enables the main cell 60 to be accessed. On the other hand, if the memory address and the input address are in a match, the comparison signal 64 shows a match, i.e. "1" level, which enables the spare cell 52 to be accessed.

If a redundant circuit as described above is configured by an erasable element such as a DRAM, an SRAM or an EPROM, and a check detects a failure in the redundant circuit after check data are written to the redundant circuit, there is no problem because the check data of the redundant circuit can be erased. That is, if the existence of a failure in a redundant circuit is detected after the redundant circuit (its spare cell) is checked, a processing to avoid using the redundant circuit is possible.

However, if the redundant circuit is configured by an unerasable element such as a PROM or a mask ROM, a check to detect a failure in the redundant circuit cannot be performed, because once check data are written to the redundant circuit (its spare cell), they cannot be erased. This prevents the data assumed to be written to the redundant circuit from being written.

In a redundant circuit, a faulty address memory part and a status memory part are configured by a PROM. The faulty address memory part and the status memory part are so configured that they cannot erase or rewrite data, whether they comprise an erasable/rewritable PROM or an unerasable/unrewritable PROM. An example of the former is a fuse cut type PROM and an example of the latter is an EPROM memory element that is shielded from light. An unerasable/unrewritable PROM is used because a feared misaction, that a row or a column containing a failure gets accessed since the row or the column assumed to be replaced becomes different from the row or the column containing a failure when the redundant circuit is actually used, does not actually occur.

As described so far, if a redundant circuit (its spare cell) uses an unerasable element, the redundant circuit cannot be checked by writing check data into it. Incidentally, recently, there have been cases of semiconductor memory devices having multiple redundant circuits, e.g. two. In this case, the semiconductor memory device is operable, even if one of the two redundant circuits has a failure, if the other redundant circuit does not have a failure, since the other one could be used. However, as described before, because it is impossible to check a redundant circuit by writing check data to it, it also becomes impossible to check which of the two redundant circuits used has a failure when two redundant circuits are used (one with a failure and the other without a failure), and it is possible for the one having a failure to be selected. In this case, the failure of the main cell is not eliminated and despite the existence of the other redundant circuit having no failure, the semiconductor memory device may remain faulty and the yield lowered.

SUMMARY OF THE INVENTION

An object of this invention is to provide a semiconductor memory device with more than one redundant circuit, in which, when one of the redundant circuits has a failure, it can be put out of use even after programming.

According to one feature of the present invention, a semiconductor memory device has a first memory part and more than one redundant circuit that is used when the first memory part is faulty. The redundant circuits are equipped with a second memory part, a status memory part that memorizes whether the second memory part is in the in-use or the not-in-use status, a faulty address memory part that memorizes a faulty address of the first memory part, and a comparison circuit that has the second memory part get accessed in lieu of the first memory part by outputting a match signal only if the memory address from the faulty address memory part and the input address is matched after comparison when the status memory part shows the in-use status. In each redundant circuit, the status memory part memorizes an out-of-use status meaning the second memory part has a failure. It also memorizes whether the second memory part is in the not-in-use status or the in-use status. The comparison circuit prohibits the second memory part from being accessed regardless of a match or a mismatch of a memory address from the faulty address memory part and the input address when the status memory part is in the out-of-use status. In each redundant circuit, the data originally assumed to be written are written (programmed) to the second memory part (spare cell), the data written into the second memory part are confirmed at this time, and the status memory part memorizes that the second memory part is in the out-of-use status, even after programming, when the existence of a failure in the second memory part is confirmed. In this case, the second memory part that has a failure is prohibited from being accessed regardless of a match or a mismatch of the memory address and the input address. If another redundant circuit has a second memory part (spare cell) without any failure, this second memory part is accessed when the memory address matches the input address.

According to another feature of the invention, a semiconductor memory device has a first memory part and a redundant circuit that is used when the first memory part is faulty. The redundant circuit is equipped with more than one second memory part and more than one status memory part set corresponding to the more than one second memory part. The redundant circuit comprises a plurality of second memory parts, a plurality of status memory parts provided corresponding to the second memory parts and for memorizing whether the second memory parts are in the in-use status, the not-in-use status, or the out-of-use status, the out-of-use status meaning the existence of a failure in the second memory part, a faulty address memory part that memorizes a faulty address of the first memory part, and a comparison circuit that outputs a match signal only if the memory address from the faulty address memory part is matched with the input address for selecting one second memory part corresponding to the status memory part showing the in-use status, and accessing it in lieu of the first memory part when the comparison circuit outputs a match signal and one of the status memory parts is in the in-use status. In the redundant circuit, the data originally assumed to be written are written (programmed) to more than one second memory part (spare cell). The data written into the second memory parts are confirmed at this time and, when the existence of a failure in any second memory part is confirmed, the corresponding status memory part memorizes that the second memory part is in the out-of-use status even after programming. In this case, when the memory address and the input address match, a non-failed second memory part in the in-use status is selected and this second memory part is accessed in lieu of the first memory part. Consequently, even if an unerasable element is used in the second memory part and a preprogramming failure check is impossible, since postprogramming memorization of the existence of a failure in the second memory part as the out-of-use status in the status memory part is possible, it becomes possible to access another second memory part without any failure by avoiding the second memory part with a failure only with knowledge of the memory content of this status memory part.

PREFERRED EMBODIMENTS

The following is an explanation of the preferred embodiments of this invention, based on the drawings.

Figure 4:
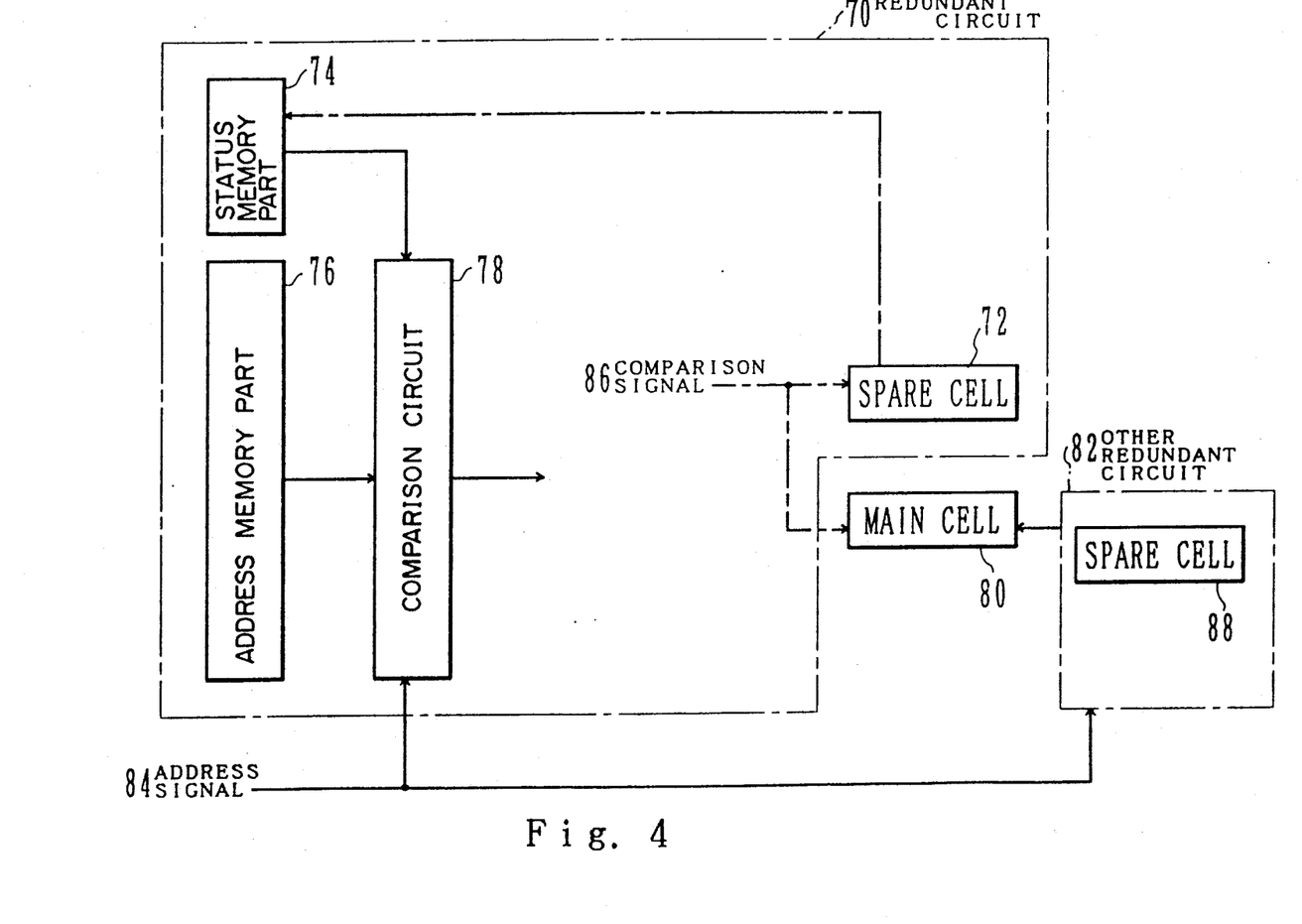
FIGS. 4 and 5 are a circuit diagram and an action explanation chart, respectively, of a redundant circuit applied to which the principle of this invention is aplied.
Figure 5:
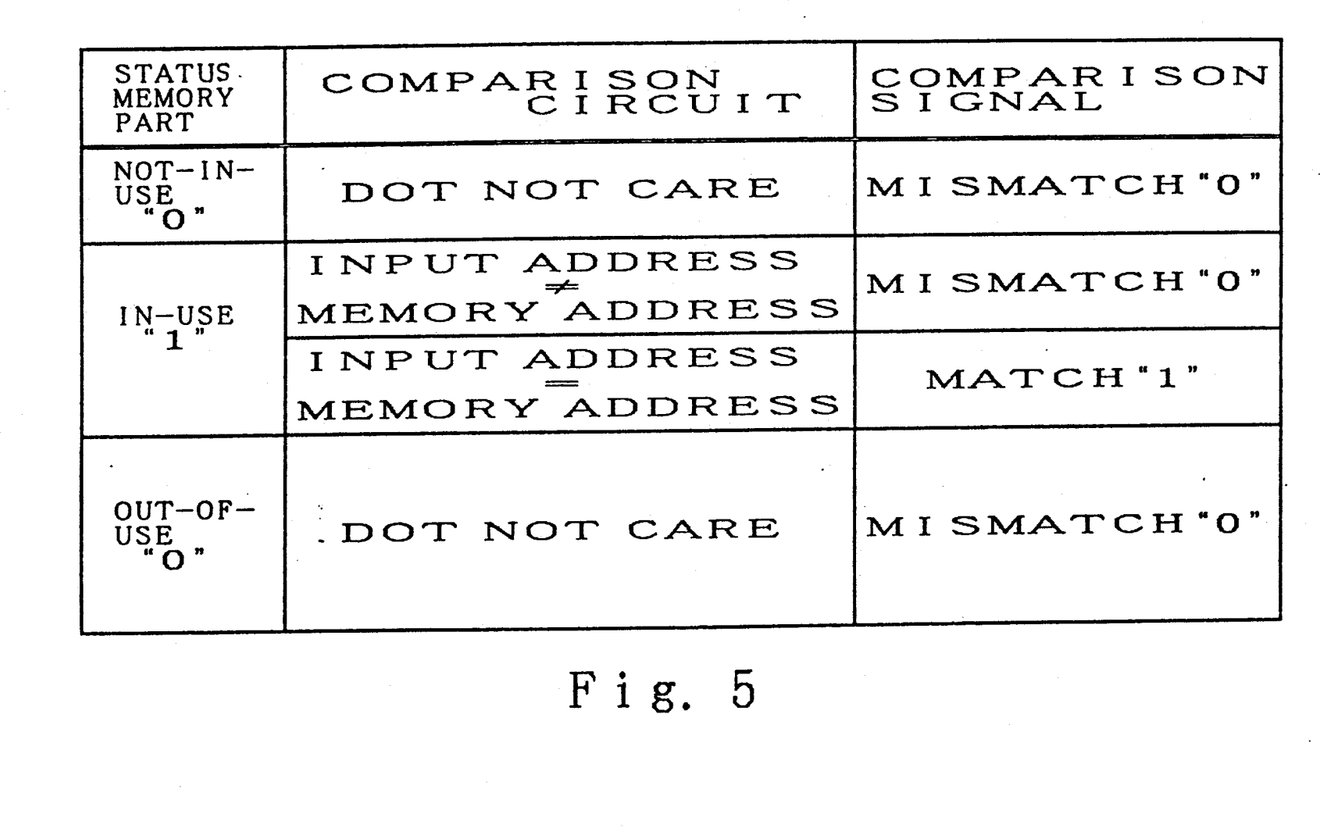

A redundant circuit to which the principle of this invention is applied, is explained by referring to FIGS. 4 and 5.

In FIG. 4, a redundant circuit 70 contains a spare cell 72 as the second memory part, a status memory part 74, an address memory part 76 and a comparison circuit 78. 80 is the main cell as the first memory part. In addition to the redundant circuit 70, another redundant circuit 82 is established, which is configured similarly to the redundant circuit 70.

In the redundant circuit 70, if the status memory part 74 shows that the spare cell 72 is in the not-in-use status, i.e. in "0" level, the comparison signal 6 from the comparison circuit 78 indicates "0" level, regardless of a match or a mismatch of the memory address from the faulty address memory part 76 with the input address of the address signal 84, which enables the main cell 80 to be accessed.

Alternatively, if the status memory part 74 shows that the spare cell 72 is in the in-use status, i.e. the "1" level, the comparison signal 86 from the comparison circuit 78 for a match of the memory address and the input address differs from that for a mismatch. That is, for a mismatch between the memory address and the input address, the comparison signal 86 indicates a mismatch, i.e. "0" level, which enables the main cell 80 to be accessed; for a match between the memory address and the input address, the comparison signal 86 indicates a match, i.e. "0" level, which enables the spare cell 72 to be accessed.

On the other hand, if the status memory part 74 shows that the spare cell 72 is in the out-of-use status, i.e. indicates "0" level, due to its own failure, the comparison signal 86 from the comparison circuit 78 indicates a mismatch, i.e. "0" level, regardless of whether there is a match or a mismatch between the memory address and the input address. This prohibits the spare cell 72 from getting accessed. If the other redundant circuit 82 without a failure has a spare cell 88, i.e., if the status memory part within the redundant circuit 82 shows that the spare cell 88 is in the in-use status ("1" level), in case of a match between the memory address and the input address, the spare cell 88 without any failure gets accessed.

Figure 6:
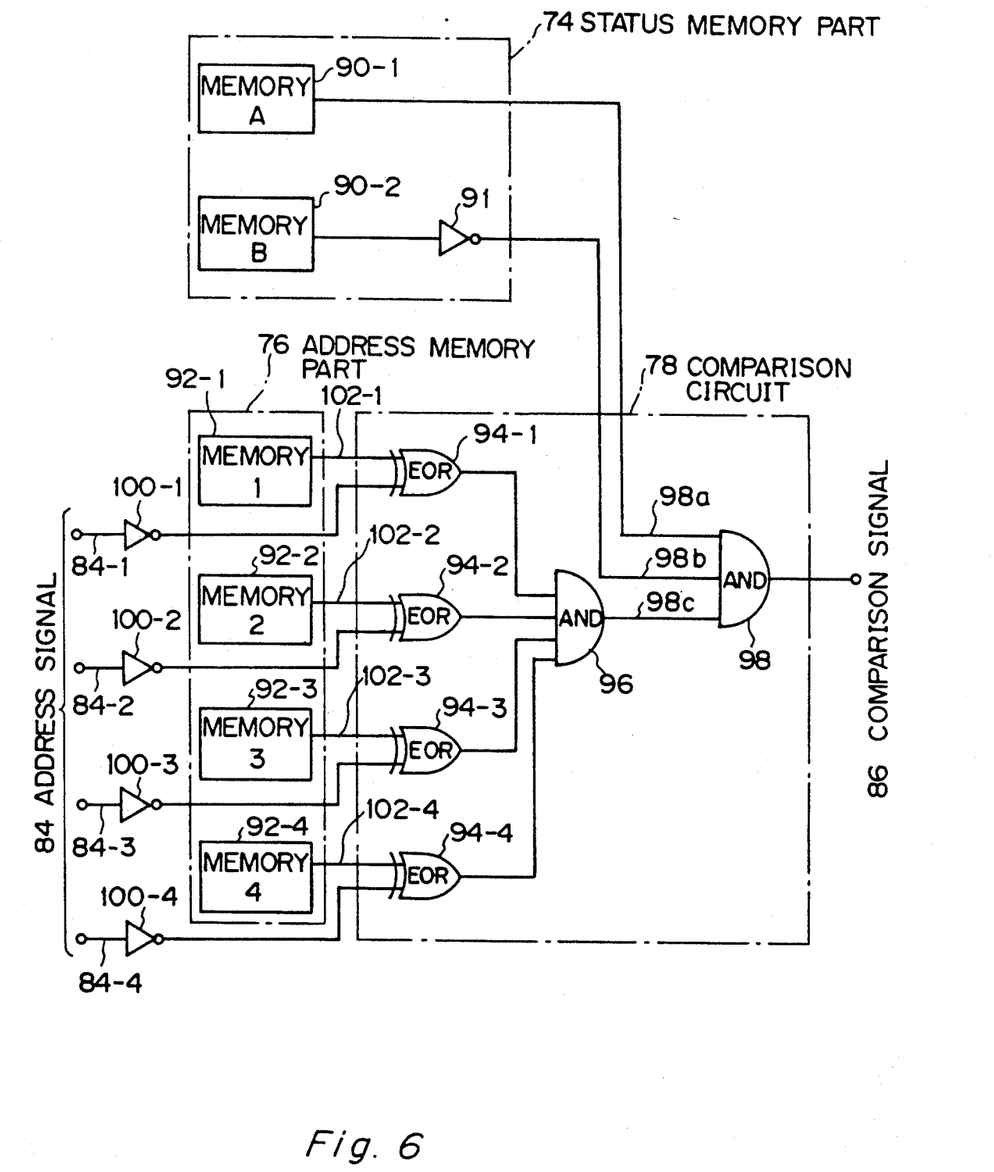
FIGS. 6 and 7 are a circuit diagram and an action explanation chart, respectively, of a redundant circuit of a first preferred embodiment of this invention.
Figure 7:
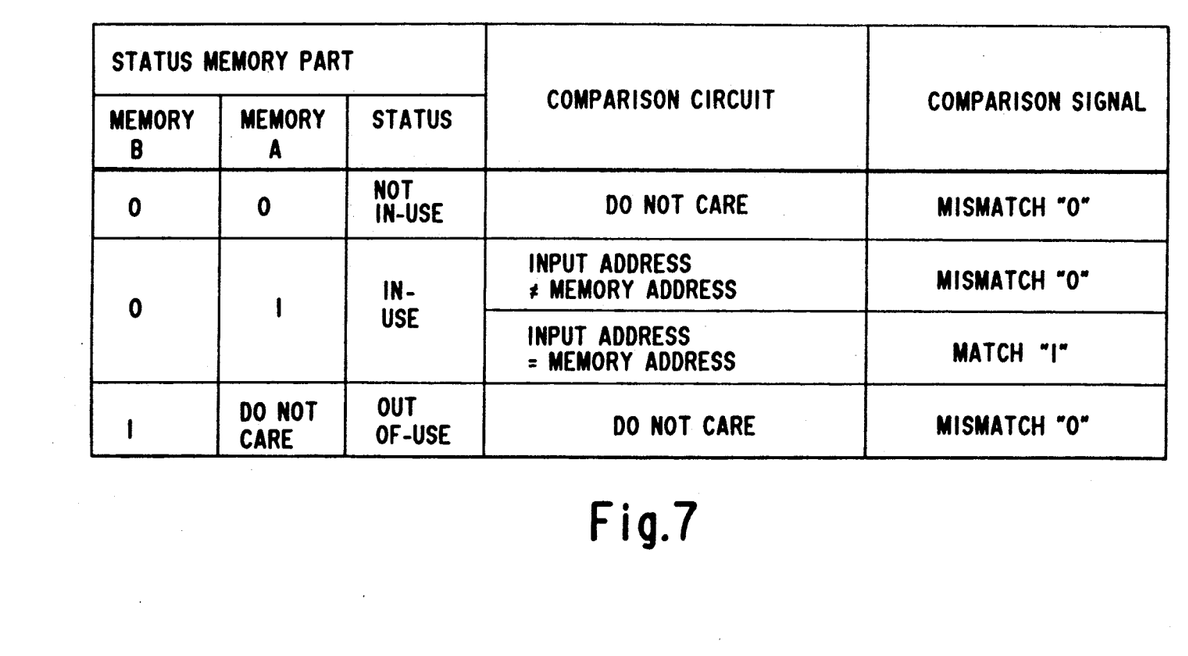

Next, FIG. 6 shows the redundant circuit of the first preferred embodiment of this invention, and FIG. 7 shows its actions.

In FIG. 6, the status memory part 74 contains a memory (A) 90-1 and a memory (B) 90-2 configured by a PROM, as well as an inverter 91. The faulty address memory part 76 contains a memory (1) 92-1, a memory (2) 92-2, a memory (3) 92-3 and a memory (4) 92-4. In FIG. 6, for simplification, only four bits worth of memories are shown. The comparison circuit 78 contains exclusive "OR" gates (EOR) 94-1, 94-2, 94-3 and 94-4, as well as "AND" gates 96 and 98. An input terminal of respective EOR 94-1 through 94-4 is connected to memories 92-1 through 92-4 and the other input terminal of the same is supplied with input addresses 84-1 through 84-4 via inverters 100-1 through 100-4.

When the status memory part 74 shows that the spare cell 72 (Refer to FIG. 4/) is in the not-in-use status, since memories 90-1 and 90-2 are both at "0" level, in the comparison circuit 78, an input terminal 98a of the "AND" gate 98 is at the "0" level. Therefore, regardless of the result of the respective comparisons between memory addresses 102-1 through 102-4 from the faulty address memory part 76, and the input addresses 84-1 through 84-4 according to the address signal the comparison signal 86 from the "AND" gate 98 indicates a mismatch, i.e. "0" level, which enables the main cell 80 (Refer to FIG. 4) to be accessed.

When the status memory part 74 indicates the in-use status, the memory 90-1 is programmed to show "1" level, whereas the memory 90-2 remains in "0" level. Therefore, in the comparison circuit 78, the input terminals 98a and 98b of the "AND" gate 98 are in a "1" level, and the "AND" gate 98 is in an ON-action-ready status. The comparison signal 86 from the "AND" gate 98 for a match of the memory address and the input address differs from that for a mismatch. That is, any respective mismatch between memory addresses 102-1 through 102-4 from memories 92-1 through 92-4 of the address memory part 76 and input addresses 84-1 through 84-4 of the address signal 84, namely, any mismatch between inputs to EOR 94-1 through 94-4, causes the comparison signal 86 from the "AND" gate 98 to indicate a mismatch, i.e. "0" level, since the output from the "AND" gate 96, i.e. the input terminal 98c of the "AND" gate 98, is at "0" level. This enables the main cell 80 to be accessed. Meanwhile, all respective matches between memory addresses 102-1 through 102-4 and input addresses 84-1 through 84-4, i.e. all respective mismatches between inputs to EOR 94-1 through 94-4, cause the comparison signal 86 from the "AND" gate 98 to indicate a match, i.e. "1" level, since the output from the "AND" gate 96, i.e. input terminal 98c of the "AND" gate 98, is at "1" level, which enables the spare cell 72 to be accessed.

When the status memory part 74 shows that the spare cell 72 is out of use due to its own failure, even after memory 90-1 is programmed (memory 90-1 is at "1" level) since memory 90-2 is programmed to indicate "1" level, in the comparison circuit 78, an input terminal 98b of the "AND" gate 98 is at "0" level. Consequently, even if the output from the memory 90-1 in the status memory part 74 is at "1" level, and regardless of the result of the respective comparison between memory addresses 102-1 through 102-4 and input addresses 84-1 through 84-4, the comparison signal 86 from the "AND" gate 98 indicates a mismatch, i.e. "0" level, which prohibits the spare cell 72 from being accessed. If the other redundant circuit 82 (refer to FIG. 4) has a spare cell 88 without any failure, when the memory address and the input address are matched, this spare cell 88 is accessed.

Figure 8:
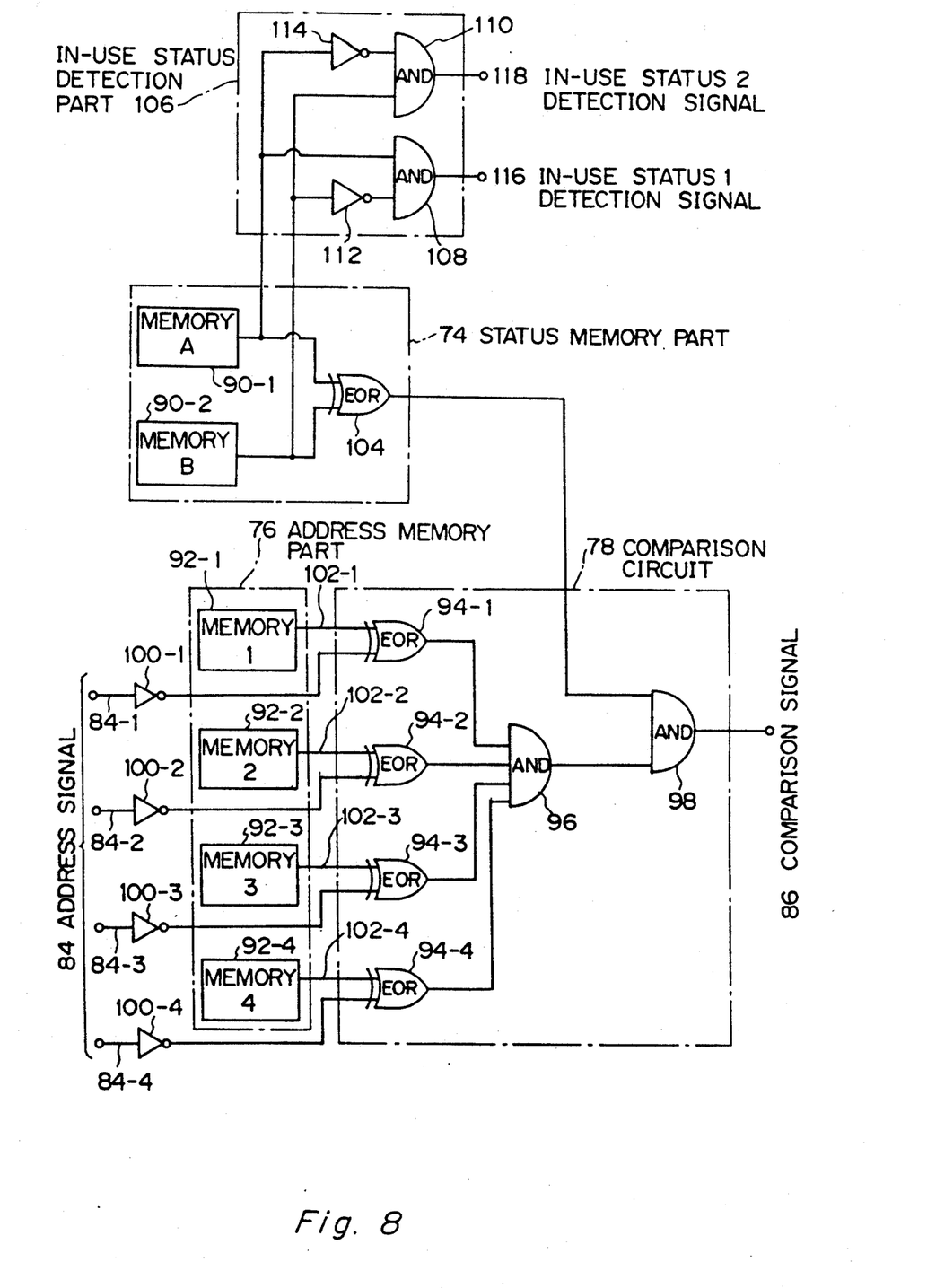
FIGS. 8 and 9 are a circuit diagram and an action explanation chart, respectively, of a redundant circuit of a second preferred embodiment of this invention.
Figure 9:
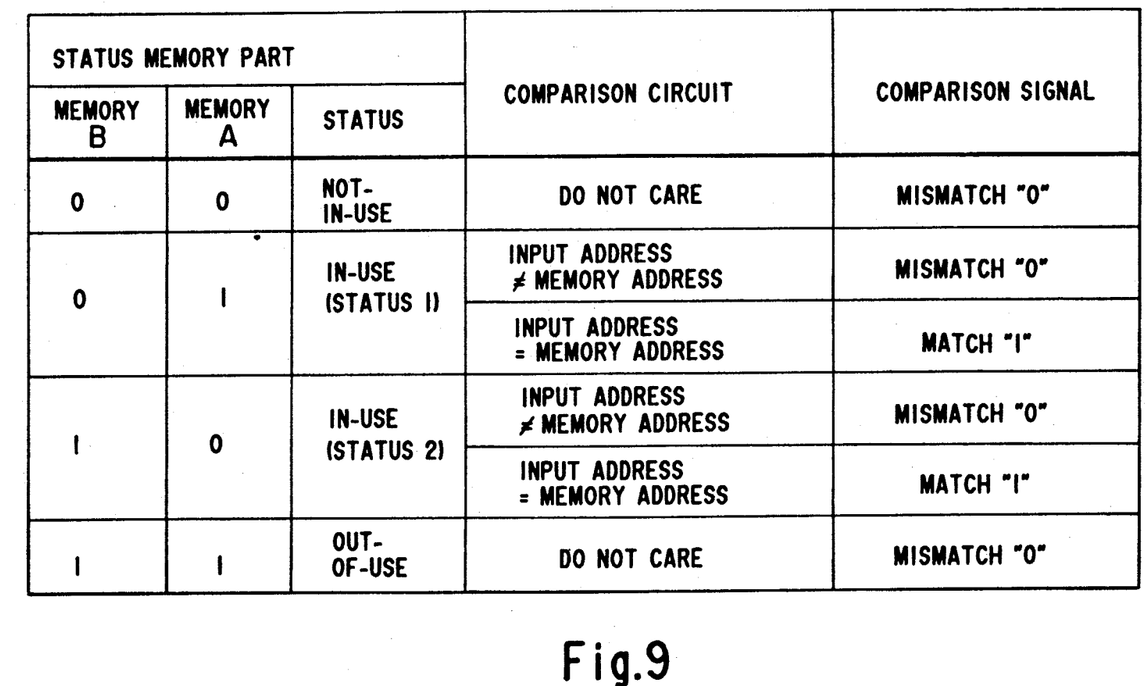

Next, FIG. 8 shows the redundant circuit of the second preferred embodiment of this invention, and FIG. 9 shows its actions.

In the first preferred embodiment described before, memory 90-1 indicates the not-in-use status or the in-use status, memory 90-2 indicates a usable status or the out-of-use status. Since memories 90-1 and 90-2 are independent in their roles, the use of those two memories produces four combinations. In the second embodiment shown in FIGS. 8 and 9, there are two use statuses. (In the first embodiment, there is only one use status.)

Namely, as shown in FIG. 9, when memory (A) 90-1 shows "1" level and memory (B) 90-2 shows "0" level, the status memory part 74 realizes an in-use status 1. When memory (A) 90-1 shows "0" level and memory (B) 90-2 shows "1" level, the status memory part 74 realizes an in-use status 2. In FIG. 8, the status memory part 74 contains an EOR 104 besides memories 90-1 and 90-2; the in-use status detection part 106 contains "AND" gates 108 and 110 as well as inverters 112 and 114, and can detect whether the status memory part 74 realizes the in-use status 1 or in-use status 2. That is, when the status memory part 74 realizes the in-use status 1, since memory 90-1 shows "1" level and memory 90-2 shows "0" level, the in-use status 1 detection signal 116 from "AND" gate 108 realizes "1" level. When the status memory part 74 realizes the in-use status 2, since memory 90-1 shows "0" level and memory 90-2 shows "1" level, the in-use status 2 detection signal 118 from "AND" gate 110 realizes "1" level. When the two memories 90-1 and 90-2 both show "0" level, the status memory part 74 realizes the not-in-use status. When they both show "1" level, status memory part 74 realizes the out-of-use status and their processings are similar to those of the first embodiment.

Figure 10:
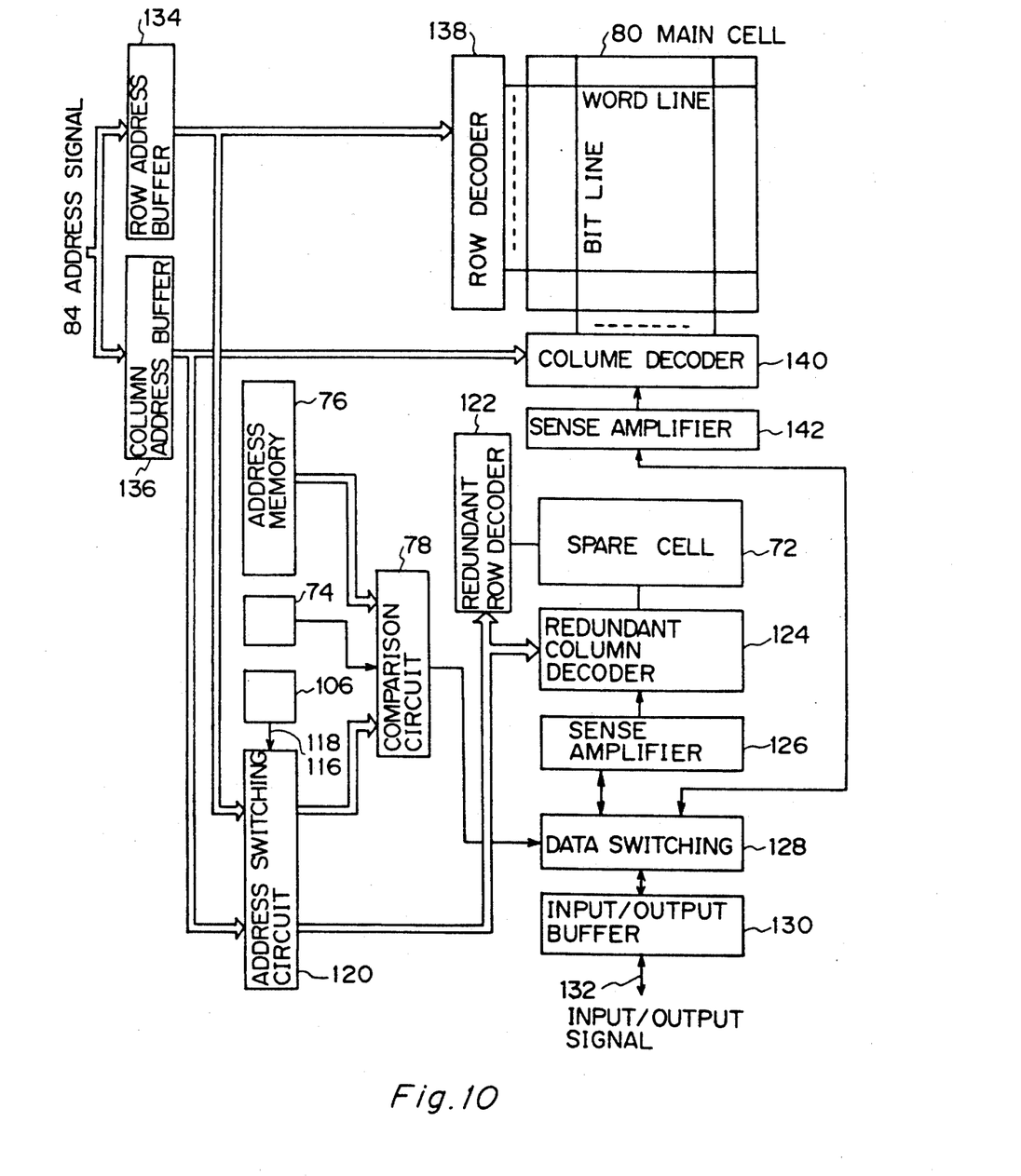
FIG. 10 is a system configuration chart of a semiconductor device that can change between a row side relief and a column side relief.

When the redundant circuit in the second embodiment is configured to be able to change between the row side relief and the column side relief, e.g. with a mask ROM, it can memorize whether it relieves the row side or the column side as the in-use status 1 or the in-use status 2, respectively. FIG. 10 shows an example of the system configuration of a semiconductor device in such a case. In FIG. 10, based on the memory content of the status memory part 74 (configured the same as that of FIG. 8), the in-use status detection part 106 (configured the same as that of FIG. 8) outputs either the in-use status 1 detection signal 116 or the in-use status 2 detection signal 118, according to which an address switching circuit 120 changes the relief direction. That is, the address switching circuit 120 changes the relief direction either in the row direction (word line direction) or in the column direction (bit line direction), respectively, when the in-use status detection part 106 outputs either the in-use status 1 detection signal 116 or the in-use status 2 detection signal 118. In FIG. 10, 122 is a redundant row decoder, 124 is a redundant column decoder, 126 is a sense amplifier, 128 is a data switching circuit, 130 is an input/output buffer, 132 is an input/output signal, 134 is a row address buffer, 136 is a column address buffer, 138 is a row decoder, 140 is a column decoder and 142 is a sense amplifier.

What is common between the first and second embodiments is explained below. When the spare cell 72 is in the not-in-use status, neither memories 90-1 nor 90-2 in the status memory part 74 are programmed ("0" level). When the spare cell 72 is in a in-use status, either memory 90-1 or 90-2 is programmed ("1" level) and the other is not programmed ("0" level). Thus, the unprogrammed memory remains at "0" level. When an existence of a failure in the spare cell 72 is confirmed and the spare cell 72 is put in the out-of-use status, the spare cell 72 is put in the out-of-use status by programming (putting the "1" level to) the memory not yet programmed. Thus, the spare cell 72 is not accessed, regardless of a match or a mismatch between memory addresses 102-1 through 102-4 and input addresses 84-1 through 84-4.

Figure 11:
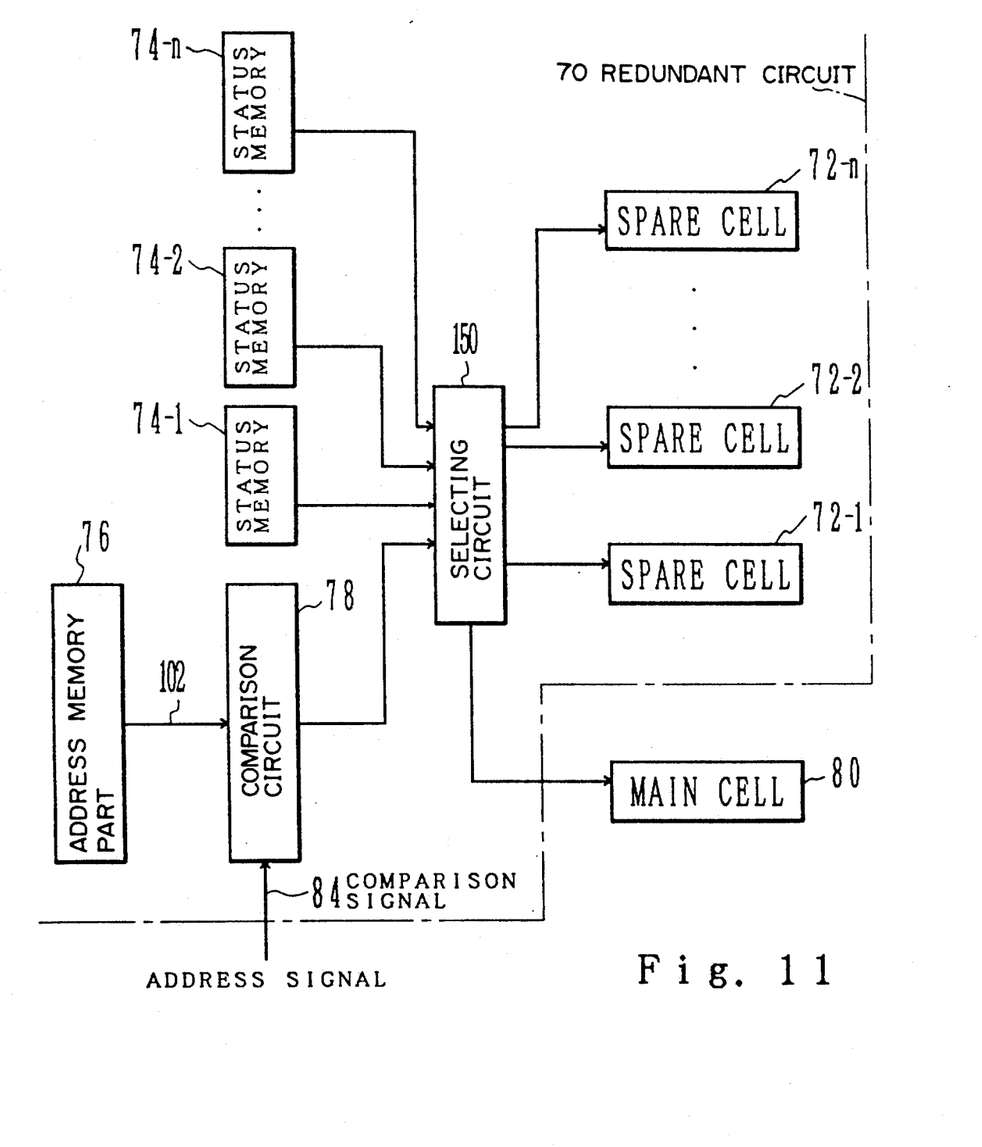
FIGS. 11 and 12 are a circuit diagram and an action explanation chart, respectively, of a redundant circuit of a third preferred embodiment of this invention.
Figure 12:
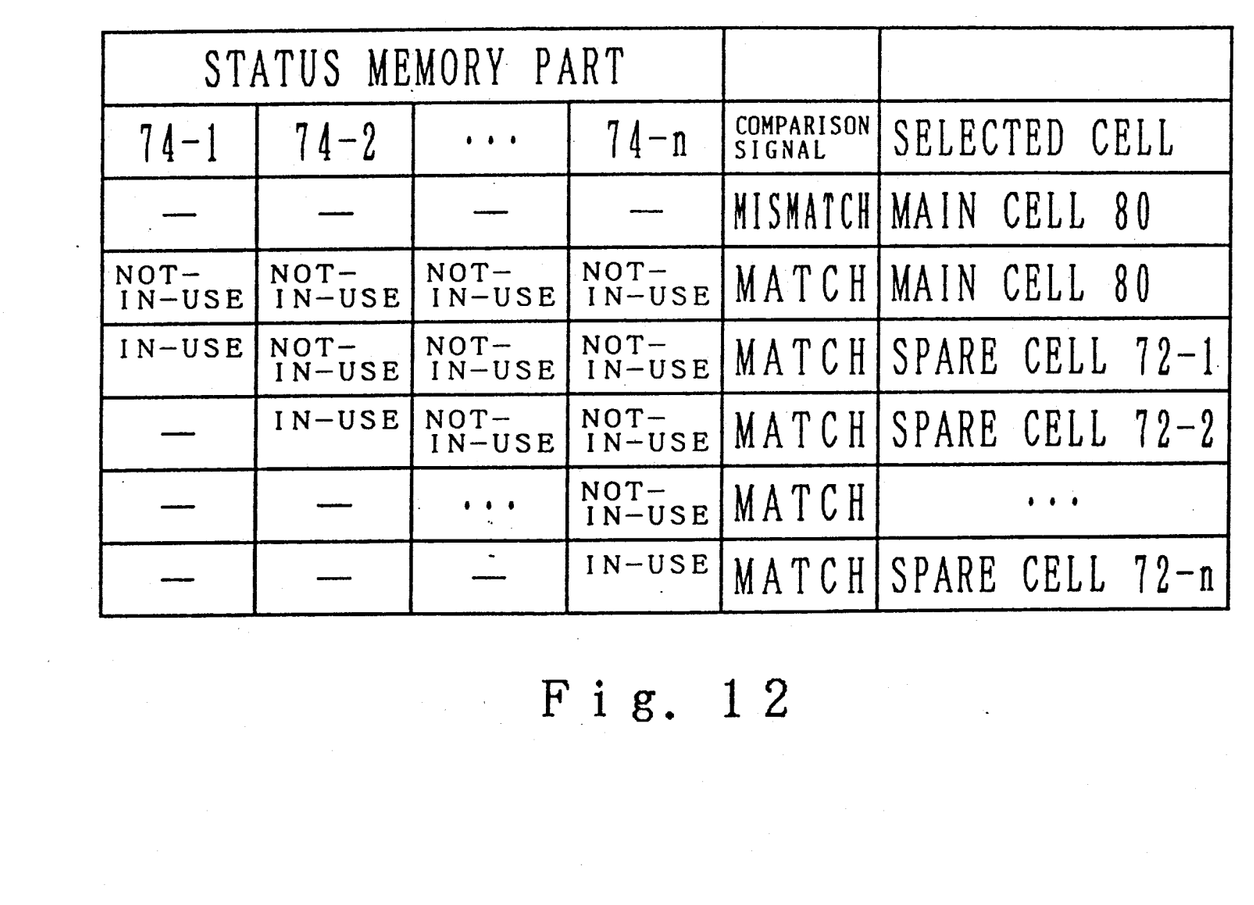

Next, FIG. 11 shows the redundant circuit of the third preferred embodiment of this invention, and FIG. 12 shows its actions.

In both the first and second embodiments previously described, each of more than one redundant circuit is configured to be equipped with the spare cell 72, the status memory part 74, the faulty address memory part 76 and the comparison circuit 78. In this third embodiment, the more than one spare cell 72-1 through 72-n is configured to have only one piece of the faulty address memory part 76 and the comparison circuit 78. That is shown in FIG. 11, the configuration of the third embodiment is as follows. One piece of the redundant circuit 70 has more than one spare cell 72-1 through 72-n and more than one status memory part 74-1 through 74-n, each set to correspond to one of the spare cells 72-1 through 72-n. The newly set selection circuit 150 properly selects one spare cell to be accessed among the more than one spare cell 72-1 through 72-n, according to the memory content of each of the status memory parts 74-1 through 74-n and the comparison signal from the comparison circuit 78.

This configuration produces the action shown in FIG. 12. That is, if the memory address 102 of the faulty address memory part 76 and the input address 84 match, and the comparison circuit 78 outputs a matching signal, and any of the status memory parts 74-1 through 74-n show the in-use status, the selection circuit 150 selects one spare cell to correspond to the status memory part that shows the in-use status, and this spare cell is accessed in lieu of the main cell 80. However, even if the comparison circuit 78 outputs a matching signal, unless any of the status memory parts 74-1 through 74-n shows the in-use status, the main cell 80 is selected. On the other hand, if the comparison circuit 78 does not output a matching signal (in case of a mismatch), regardless of the content of the status memory parts 74-1 through 74-n, the main cell 80 is selected. Of course, when an existence of a failure after programming spare cells 72-1 through 72-n is confirmed by having the status memory part corresponding to the spare cell with the failure to memorize the out-of-use status, the selection circuit 150 is prohibited from selecting the spare cell.

The concrete circuit configurations of this invention shown in FIGS. 6 and 8 are simply examples. This invention is by no means limited to such configurations.

As explained above, if there is more than one spare cell (second memory part) and at least one of them has a failure, this invention puts the failed spare cell in the out-of-use status. Then, if another spare cell does not have a failure, the spare cell without a failure is put into use. Therefore, this invention improves the yield of a semiconductor memory device.

What is claimed is:
1. A semiconductor memory device, comprising:
a first memory part, and
a plurality of redundant circuit means used when said first memory part is faulty;
each said redundant circuit means comprising
a second memory part,
a status memory part means for storing first data indicating whether said memory part is in a not-in-use status or in an in-use status, and for storing said second data indicating an out-of-use status when said second memory part has a failure,
a faulty address memory part means for storing a faulty address of said first memory part, and
a comparison circuit means responsive to said status memory part means, for comparing an input address and a memory address from said faulty address memory part when said status memory part is in the in-use status, and outputting a match signal enabling said second memory part to be accessed only when said input address and said memory address from said faulty address memory part both match, and for prohibiting said second memory part from being accessed regardless of a match or a mismatch between the input address and the memory address from said faulty address memory part when said second data stored in said status memory part indicates the out-of-use status.

2. A semiconductor memory device according to claim 1, wherein
in said plurality of redundant circuit means, when said second data stored in said status memory part means indicates the out-of-use status, and the input address and the memory address of said faulty address memory part means match, said status memory part means is enabled to access said second memory part of another one of said plurality of redundant circuit means that contains said second data indicating the in-use status.

3. A semiconductor memory device according to claim 1, wherein
data written in said second memory part are checked to determine an existence of a failure in said second memory part, and upon existence of a failure in said second memory part, said second data stored in said status memory part means in the same redundant circuit means as said second memory part is changed to indicate the out-of-use status.

4. The semiconductor device according to claim 1, wherein
said status memory part means has a memory means for storing data indicating whether said second memory part is in the in-use status or in the not-in-use status and another memory means for storing data indicating whether said second memory part is in a usable status or in the out-of-use status.

5. The semiconductor device according to claim 1, wherein
said status memory part means has two memory means and said first data and said second data stored in said status memory part means together indicate whether said second memory part is in the first in-use status, in the second in-use status, in the not-in-use status, or in the out-of-use status, according to the combination of said two memory means.

6. A semiconductor memory, comprising:
a first memory part, and
a redundant circuit used when said first memory part is faulty;
said redundant circuit comprising
a plurality of second memory parts, a plurality of status memory parts set corresponding to each of said plurality of second memory parts for storing data indicating whether each of said plurality of second memory parts is in a not-in-use status in an in-use status, or in an out-of-use status indicating that the second memory part has a failure,
a faulty address memory part means for storing a faulty address of said first memory part, and
a comparison circuit means responsive to said status memory part, for outputting a match signal when an input address and a memory address from said faulty address memory part are in a match after being compared, and
a selection circuit means for selecting one second memory part which corresponds to the status memory part means having the data indicating the in-use status when said comparison circuit means outputs a match signal and any of said plurality of status memory parts has the data indicating the in-use status, and allowing the selected second memory part to be accessed in lieu of said first memory part.

7. A semiconductor memory according to claim 6, wherein
data written to said plurality of second memory parts are checked to determine an existence of a failure in any of said plurality of second memory parts, and upon existence of a failure in any of said second memory parts, said data stored in said status memory part that corresponds to the second memory part with a failure is changed to indicate the out-of-use status.

* * * * *